United States Patent [19]

Komuro et al.

[11] Patent Number: 4,983,575
[45] Date of Patent: Jan. 8, 1991

[54] SUPERCONDUCTING THIN FILMS MADE OF STACKED COMPOSITE OXIDE LAYERS

[75] Inventors: Matahiro Komuro, Hitachi; Yuzo Kozono, Hitachiota; Shinji Narishige; Masanobu Hanazono, both of Mito, all of Japan

[73] Assignee: Hitachi, Ltd., Tokyo, Japan

[21] Appl. No.: 172,498

[22] Filed: Mar. 24, 1988

[30] Foreign Application Priority Data

Mar. 25, 1987 [JP] Japan .................................. 62-68884

[51] Int. Cl.$^5$ ............................................. H01L 39/22
[52] U.S. Cl. .................................... 505/001; 156/610; 428/688; 437/910; 505/701; 505/729
[58] Field of Search ...................... 505/001, 701, 729; 156/610; 428/688; 437/910

[56] References Cited

PUBLICATIONS

KWO et al. in Novel Superconductivity ed., S. A. Wolf et al., June 1987, Plenum, N.Y., p. 699, Chang et al. Appl. Phys. Letts., 52 (Jan. 1988) 72 Tsaur. et al. Appl. Phys. Letts. 51 (Sept. 1987) 858.
Adachi et al., Phys. Rev. 35B, (June 1, 1987) 8824.
Koinuma et al., Jour. Appl. Phys. 62 (Aug. 15, 1987) 1524.
Webb et al., Appl. Phys. Letts. 51 (Oct. 12, 1987) 1192.
Bednorz and Müller, Z. Physik, 64B.
Bao et al. in Int. Jour. Mod. Phys. B-1, June–Jul. 1987, p. 535.
Nagata et al., Jap. Jour. Appl. Phys. 26 (Apr. 1987) L-410.
Siegrist et al., Phys. Rev. 35B (May 1, 1987) 7137.
Laibowitz et al., Phys. Rev. 35B (June 1, 1987) 8821.

*Primary Examiner*—Upendra Roy
*Attorney, Agent, or Firm*—Antonelli, Terry, Stout & Kraus

[57] ABSTRACT

A superconducting thin film obtained by laminating a Cu-O atomic pair film and another oxide film while growing in one direction shows a higher superconducting critical temperature (Tc). By alternately laminating a thin film of $A_2CuO_4$ and a thin film of $L_2CuO_4$, wherein A and L are different rare earth elements, the Tc can be enhanced remarkably.

3 Claims, 9 Drawing Sheets

F I G . I

F I G . 4
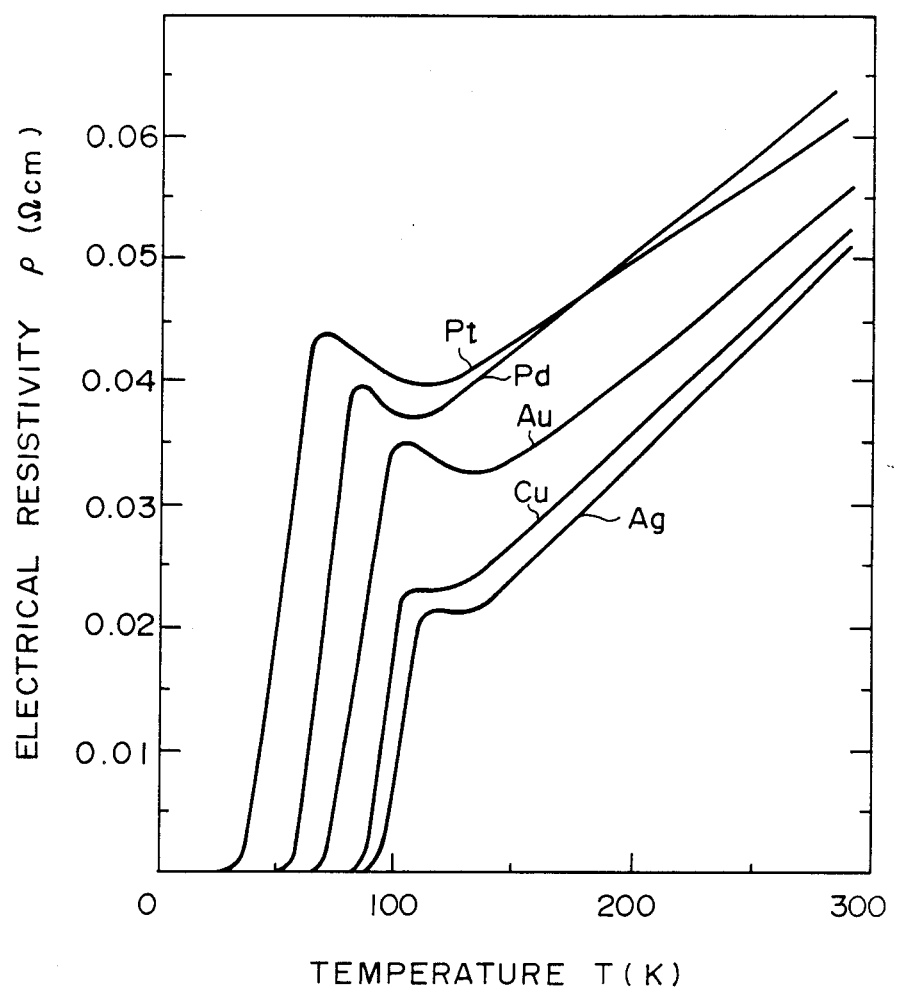

F I G. 5
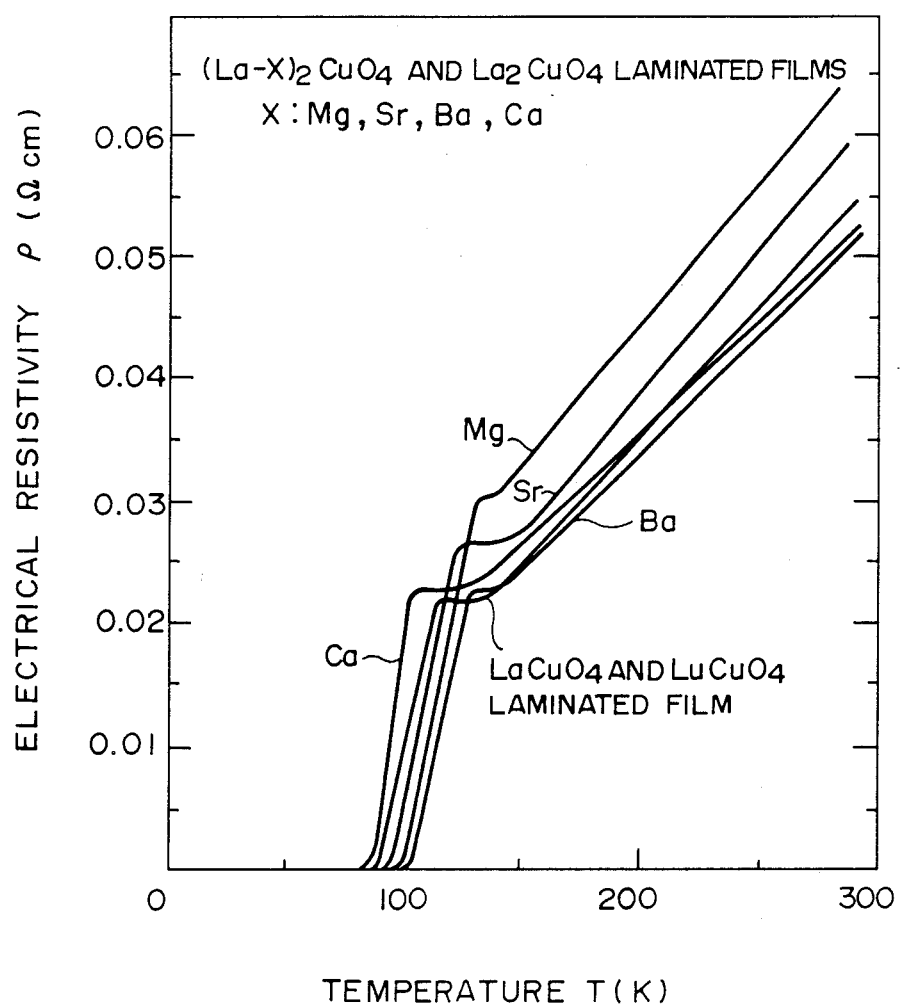

SUPERCONDUCTING THIN FILMS MADE OF STACKED COMPOSITE OXIDE LAYERS

BACKGROUND OF THE INVENTION

This invention relates to superconducting thin films obtained by laminating rare earth oxide thin films and having higher superconducting critical temperatures (Tc), and processes for producing the same.

It is reported in J. Phys. Soc. Japan, vol. 42(2), pp208-209 (1987) that superconductivity appears when a part of La in $La_2CuO_4$, which is known as a conductive oxide having a layered perovskite structure, is replaced by Ba to make Tc over 30K. Possible high Tc superconductivity in the Ba—La—Cu—O system is discussed by J. G. Bednorz and K. A. Mülluer in Z. Phys. B-Condensed Matter 64, 189-193 (1986). But the materials disclosed therein are still low in Tc. Thus, materials having higher Tc are desired.

SUMMARY OF THE INVENTION

It is an object of this invention to provide a superconducting material having a crystal structure similar to a perovskite crystal structure and having a higher Tc.

This invention provides a superconducting thin film obtained by laminating a Cu—O atomic pair film and another oxide film while growing them in one direction.

This invention also provides a superconducting material obtained by alternately laminating a thin film of $A_2CuO_4$ and a thin film of $L_2CuO_4$, , wherein A and L are different rare earth elements.

This invention further provides a process for producing the above-mentioned superconducting thin film or superconducting material by a molecular beam epitaxial method or a sputtering method.

BRIEF DESCRIPTION OF THE DRAWINGS

FIGS. 1 to 6 are graphs showing a relationship between the electrical resistivity and the temperature of various superconducting thin film materials.

DESCRIPTION OF THE PREFERRED EMBODIMENTS

Figure 7:
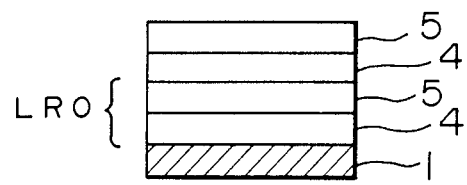
FIG. 7 is a cross-sectional view of a superconducting thin film formed on a substrate.

The superconducting thin film of this invention has a structure as shown in FIG. 7 wherein numeral 1 denotes a substrate, numeral 2 a Cu—O atomic pair film and numeral 3 another oxide (M-O) film. The term "another oxide" includes oxides of at least one element selected from the group consisting of Na, K, Be, Mg, Ca, Sr, Ba, Sc, Y, the lanthanide elements 57 at 71 (La to Lu), Ti, Zr, V, Nb, In, Sn, Tl, Po, Ir, Bi and Pb. As the substrate, there can be used sapphire, MgO, zirconia, and the like which do not react with a film formed thereon.

More in detail, a thin film of Cu—O atomic pair and a thin film of M—O are formed alone or repeatedly by a molecular beam epitaxial (MBE) method or a sputtering method on the substrate in one direction, e.g. along the c axis, with a long range ordering (LRO) which is a total thickness of the Cu—O thin film and the M—O thin film of more than 11.3 Å without succeeding heat treatment at 900° C. or lower.

The resulting superconducting thin film has a crystal structure similar to a perovskite crystal structure locating a Cu atom at a center of an octahedron and having metal (M) atoms at the top and bottom points of the octahedron. At least a part of Cu can be replaced by one or more face-centered cubic elements such as Ag, Au, etc.

The superconducting thin film of this invention preferably has a thickness of about 100Å and can have a thickness of as large as about 1000 Å. The superconducting thin film can be used by separating it from the substrate or without separating from the substrate.

Preferable examples of the superconducting thin films obtained by laminating a Cu—O film and a M—O film are a thin film of repeated Cu—O and La—O with a LRO of larger than 11.3 Å.

The structure and production of the superconducting thin film comprising Cu—O and M—O are explained more in detail below.

Figure 10:
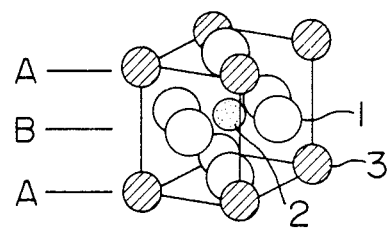
FIG. 10 is a perspective view of the crystal structure of a unit lattice.

FIG. 10 is a perspective view of the crystal structure of a unit lattice similar to the perovskite structure. The structure of FIG. 10 is a fundamental one common to the $K_2NiF_4$ type, $Sr_3Ti_2O_7$ type, $Sr_4Ti_3O_{10}$ type and $Bi_4Ti_3O_{12}$ type structures. As is clear from FIG. 10, the perovskite-type structure comprises a layer A including an atomic pair of M atoms 3 and O (oxygen) atom 1, and a layer B including an atomic pair of Cu atom 2 and 0 atoms 1 laminated on the layer A. The $K_2NiF_4$ type, $Sr_3Ti_2O_7$ type, $Sr_4Ti_3O_{10}$ type and $Bi_4Ti_3O_{12}$ type perovskite structures are present as stable phases. Materials having laminated A layers and B layers can be produced artificially with a laminated period D by the MBE method or the sputtering method. The layer A can be produced by using an oxide of M atom by vapor deposition or sputtering.

Table 1 shows oxides of M atoms used in the vapor deposition or sputtering. Conditions for the vapor deposition and sputtering are shown in Tables 2 and 3. During the vapor deposition, the oxygen gas pressure was controlled at a pressure of $1\times10^{-3}$ Torr or less. But, it is also possible to produce a laminated film having the laminated period D by carrying out vapor deposition of M atom single body in an atmosphere containing oxygen.

TABLE 1

| M atom | Oxide | Tc(K) | M atom | Oxide | Tc(K) |
|---|---|---|---|---|---|
| Na | $Na_2O$ | 25 | o Pb | $PbO_2$ | 37 |
| K | $KO_2$ | 28 | o Bi | $Bi_2O_3$ | 56 |
| o Be | BeO | 46 | Po | $PoO_2$ | 53 |
| o Mg | MgO | 51 | Ir | $IrO_2$ | 29 |
| o Ca | $CaO_2$ | 58 | Ce | $CeO_2$ | 31 |
| o Sr | $SrO_2$ | 55 | Pr | $Pr_2O_3$ | 47 |
| o Ba | $BaO_2$ | 31 | Nd | $Nd_2O_3$ | 21 |
| o Sc | $Sc_2O_3$ | 25 | Sm | $Sm_2O_3$ | 17 |
| o Y | $Y_2O_3$ | 28 | Eu | $Eu_2O_3$ | 15 |
| La | $La_2O_3$ | 22 | Gd | $Gd_2O_3$ | 13 |
| Ti | $TiO_2$ | 41 | Tb | $Tb_4O_7$ | 27 |
| Zr | $ZrO_2$ | 43 | Dy | $Dy_2O_3$ | 34 |
| V | $V_2O_3$ | 37 | Ho | $Ho_2O_3$ | 48 |
| Nb | $NbO_2$ | 40 | Er | $Er_2O_3$ | 51 |
| o In | $In_2O_3$ | 53 | Tm | $Tm_2O_3$ | 62 |
| o Sn | $SnO_2$ | 62 | Yb | $Yb_2O_3$ | 63 |
| o Tl | $Tl_2O_3$ | 75 | Lu | $Lu_2O_3$ | 71 |

TABLE 2

| Vapor deposition conditions | |
| --- | --- |
| Reached degree of vacuum | $<1 \times 10^{-10}$ Torr |
| Substrate temperature | $>300°$ C. |
| Vapor deposition rate | 0.1 − 100Å/sec |
| Substrate | $Al_2O_3$, MgO, $ZrO_2$ or Si |
| Oxygen gas pressure | $<1 \times 10^{-2}$ Torr |

TABLE 3

| Sputtering conditions | |
| --- | --- |
| Reached degree of vacuum | $<1 \times 10^{-5}$ Torr |
| Substrate temperature | $>300°$ C. |
| Sputtering atmosphere | $Ar + O_2$, or $N_2 + O_2$ |
| Oxygen partial pressure | $>1 \times 10^{-4}$ Torr |
| Substrate | $Al_2O_3$, MgO $ZrO_2$ or Si |

As the substrate used for the vapor deposition or sputtering, there can be used a substrate of $Al_2O_3$ (sapphire), MgO, $ZrO_2$ or Si. It is advantageous to use a single crystal substrate rather than a polycrystalline substrate when the film is grown while laminating films in a special direction.

Particularly important conditions among the film growing conditions are the substrate temperature and the oxygen gas pressure or the oxygen partial pressure. When the substrate temperature is 300° C. or lower, the crystal structure of the film becomes to take a structure near an amorphous structure and no laminated film grown in one direction is formed.

Figure 3:
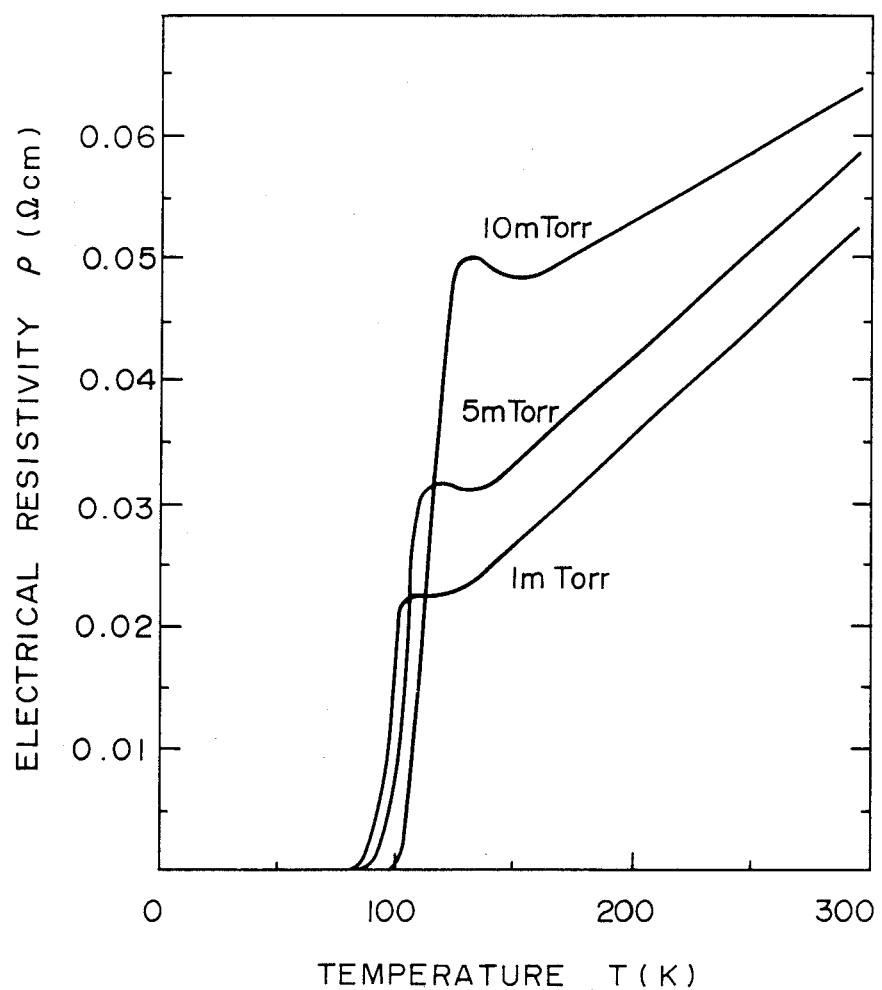

The oxygen gas pressure in the vapor deposition or the oxygen partial pressure in sputtering influences greatly on the Tc of the resulting film. This is shown, for example, in FIG. 3. When the amount of oxygen is too small, there take place a large number of oxygen defects, which results in remarkably lowering the Tc due to disorder of the periodic structure. But a small amount of oxygen defects show an effect for enhancing a critical current density (Jc) without lowering the Tc. In FIG. 3, the lower the oxygen partial pressure, the lower the electrical resistance. The Jc of the film formed at 1 mTorr is 5000 A/cm² or more, while Jc of the film formed at 10 mTorr is 1000 A/cm² or lower.

The Tc values in Table 1 mean Tc values of films of $Cu_2O$ and oxides of M atoms laminated alternately with film thickness of 1:1 on a MgO substrate with a laminated period (D) of about 12 Å ($Cu_2O$ 6 Å and MO 6 Å), total film thickness being about 0.5 μm using the vapor deposition conditions of Table 2. The periodic structure was admitted by X-ray diffraction with a small angle region. Therefore, it was found that the laminated films shown in Table 1 with the Tc values shown therein have a Cu—O atomic pair film and a M—O film, these films having been laminated alternately with regular periods and grown.

On the other hand, in the X-ray diffraction pattern with a high angle region, there were observed peaks due to the structure similar to the perovskite structure. Tc values of films obtained by sputtering using a target of oxides of M atoms shown in Table 1 and a target of $Cu_2O$ or CuO under the conditions shown in Table 3 and forming alternately laminated films having a laminated period D of 12 Å are almost the same as shown in Table 1 (±5%).

Figure 11:
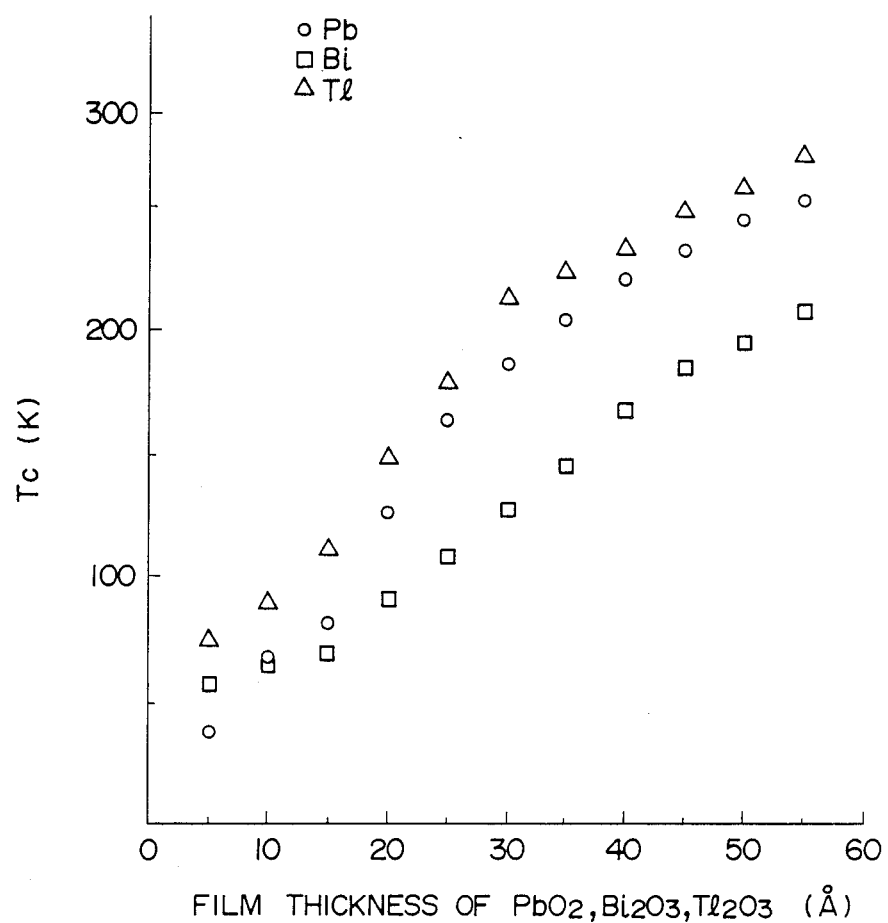
FIG. 11 is a graph showing a relationship between film thicknesses and Tc.

It was also found that when the film thickness of oxide of M atom was enlarged while retaining the film thickness of $Cu_2O$ at a constant value of 6 Å, the Tc was dependent on the film thickness of oxide of M atom. For example, in the cases of Pb, Bi and Tl as M atom with the laminated period of 12 Å and the film thickness ratio of 1:1, the Tc was lower than 100K. In contrast, when the film thickness of $Cu_2O$ was 6 Å and the film thickness of oxide of Pb, Bi or Tl was 25 Å or more, the Tc was larger than 100K as shown in FIG. 11.

A reason for enhancing the Tc as mentioned above seems to be that with an increase of the period of the long range ordering (LRO) structure, the potential of conducting electrons flowing the Cu—O pair is lowered, which results in transferring the electrons stably.

Figure 1:
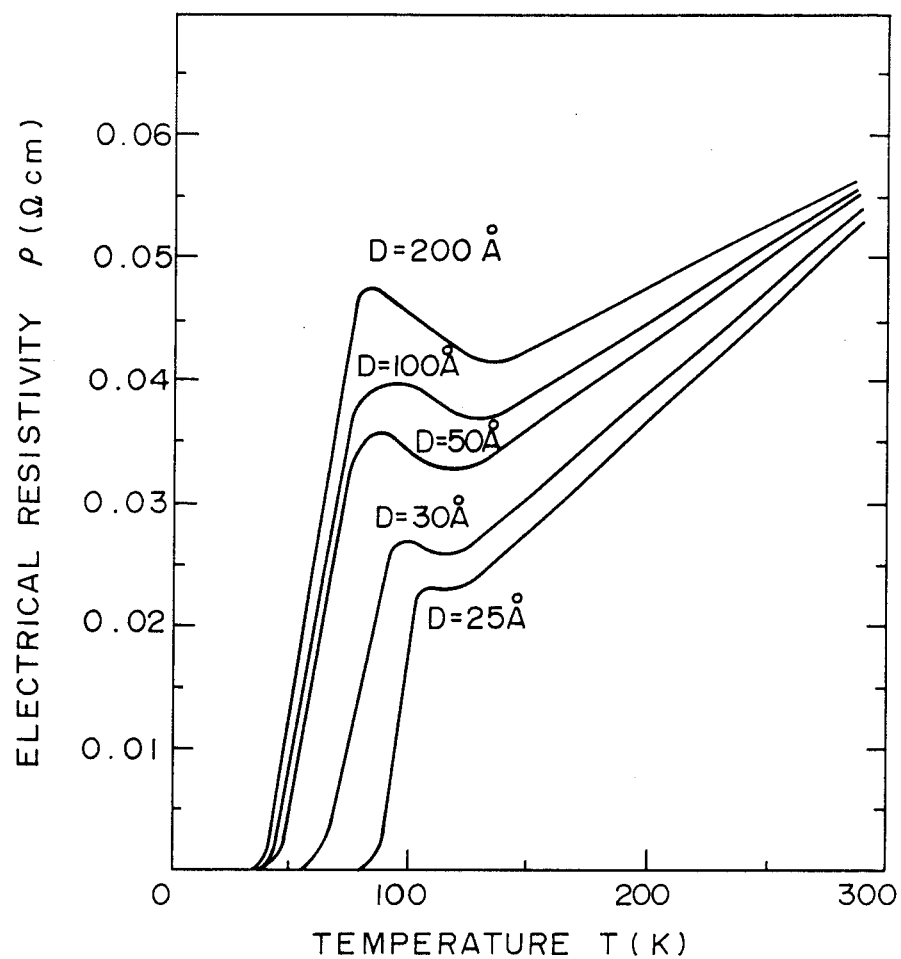
Figure 2:
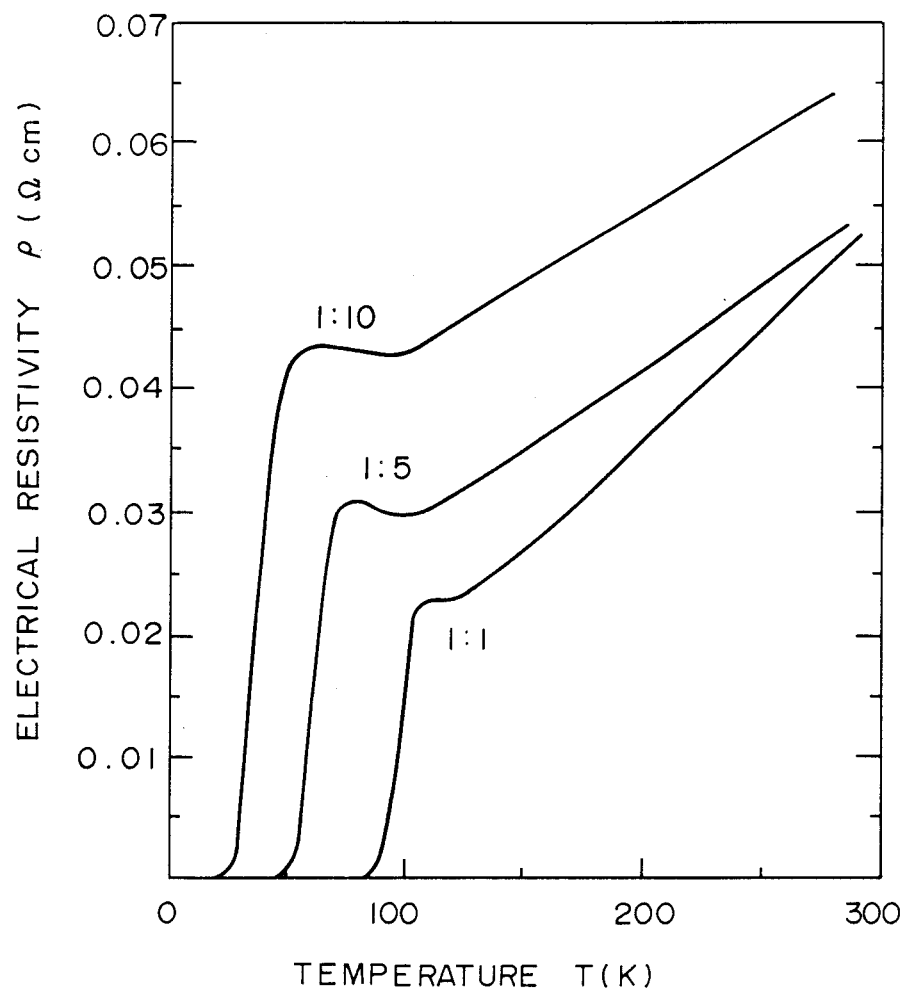

On the other hand, the film thickness ratio is changed as shown in FIGS. 1 and 2, the Tc does not exceed 100K. In FIGS. 1 and 2, since the laminated films are $A_2CuO_4$ and $L_2CuO_4$, the distance between the Cu—O atomic pair layer and the layer of oxide of A and L hardly changes even if the film thickness ratio and the laminated period D are changed. Thus, the Tc is not raised. This can be explained referring to FIGS. 7, 8 and 9.

Figure 8:
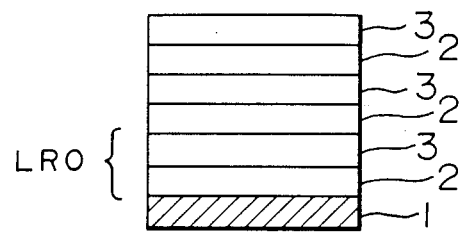
FIG. 8 is a cross-sectional view of a superconducting material formed on a substrate.
Figure 9:
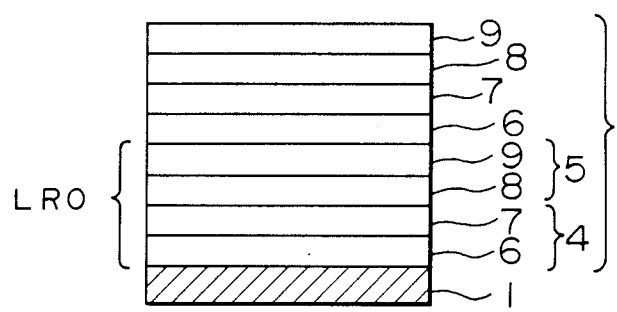
FIG. 9 is a detailed cross-sectional view of the superconducting material of FIG. 8.

In the case of laminating a film of $Cu_2O$ and a film of $Bi_2O_3$, $Cu_2O$ (2) and $Bi_2O_3$ (3) are grown on a MgO substrate (1). It was found that the laminated film had a long range ordering (LRO) structure having $Cu_2O$ (2) and $Bi_2O_3$ (3) as units by X-ray diffraction. As shown in FIG. 8, the LRO was also found by X-ray diffraction as in the case of FIG. 7. In FIG. 8, $A_2CuO_4$ (4) and $L_2CuO_4$ (5) are alternately laminated on the MgO substrate 1. As to the Cu—O atomic pair and the M—O atomic pair shown in FIGS. 7 and 8, only the Cu—O atomic pair is present in the $Cu_2O$ (2) and only the Bi-O atomic pair is present in the $Bi_2O_3$ (3), and there are 3 kinds of atomic pairs, i.e., Cu—O atomic pair, Bi-Cu atomic pair and Bi-O atomic pair, at the interface of $Cu_2O$ (2) and $Bi_2O_3$ (3) in FIG. 7. In FIG. 8, since the $A_2CuO_4$ film and the $L_2CuO_4$ film have the perovskite structure as basis, respectively, the laminated films as shown in FIG. 9 can be considered when noticing the Cu—O atomic pair. In the combination of $A_2CuO_4$ (4) and $L_2CuO_4$ (5), it can be considered that these layers comprise a Cu—O layer (6), an A—O layer (7), a Cu—O layer (8) and an L—O layer (9). Therefore, when noticing the Cu—O atomic pair layer and the M—O atomic pair layer, the structures can be shown by FIGS. 7 and 9. Therefore, in the case of changing the thickness of the Cu—O atomic pair layer, or changing the distance between the Cu—O atomic pair layers, it can be understood that these layers can be laminated as shown in FIG. 7.

The phenomenon of enhancing the Tc by thickening the film thickness of oxide of M atom as shown in FIG. 11 can also be observed in the elements marked with o in Table 1.

Figure 12:
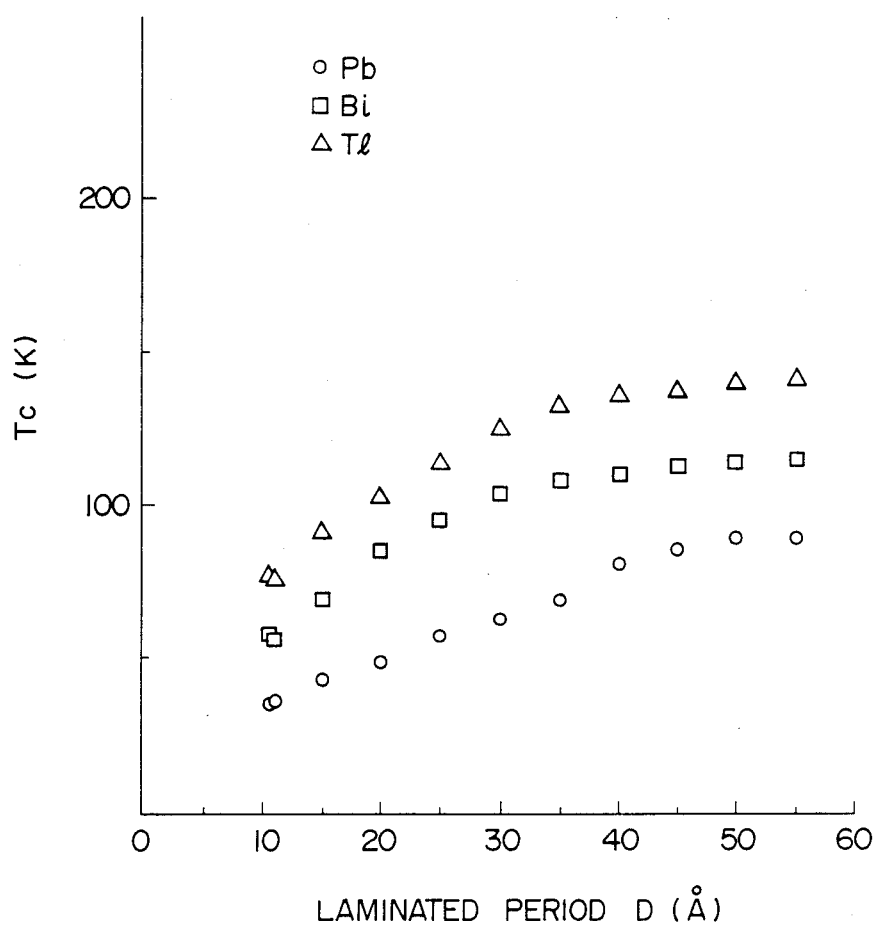
FIG. 12 is a graph showing a relationship between the laminated period D and Tc.

FIG. 12 shows a relationship between the Tc and the laminated period (D) of the films laminated by using $Cu_2O$ and $PbO_2$, $Bi_2O_3$ or $Tl_2O_3$ with the film thickness ratio of 1:1 under the vapor deposition conditions shown in Table 2. The laminated period (D) is the same as the period of long range ordering (LRO) structure obtained by X-ray diffraction pattern and is 11.4 Å or more. In FIG. 12, the Tc corresponding to D=11.4 to 55 Å is shown. But it was measured that even if D=100 Å, the Tc was more than 77K. A reason for increasing the Tc with an increase of the period D seems to be derived from the enlargement of the distance of the Cu—O atomic pair layers as shown in FIG. 11.

Another embodiment of the superconducting thin film of this invention is shown in FIGS. 8 and 9, wherein numeral 4 denotes a thin film of $A_2CuO_4$ comprising a film of Cu—O atomic pair (6) and a film of A—O (7), and numeral 5 denotes a thin film of $L_2CuO_4$ comprising a film of Cu—O atomic pair (8) and a film of L—O (9). In the above, A and L are different rare earth elements, i.e., the lanthanide elements 57 to 71 (La to Lu), plus scandium (Sc) and yttrium (Y). Rare earth oxide laminated films mentioned above have different Tc depending on the value of LRO. When the LRO is 30 Å or less, the Tc becomes 40K or higher.

Further, the Tc of rare earth oxide films changes depending on the kinds of rare earth elements constituting the rare earth oxides. In addition, the Tc depends on crystallizability and periodicidy of the rare earth oxides. Rare earth oxide films having a small defect and a short period have a high Tc. This suggests that a mutual action between electrons which pertain to superconductivity and lattices has a great influence on the Tc value. On the other hand, electrons near an interface between the Cu—O layer and the rare earth oxide layer and the lattice strain pertain to the superconductivity. When the laminated period is short and the number of interfaces increases, there takes place a uniform lattice strain in the interface to change the electronlattice mutual action, which results in increasing the Tc.

A part or whole of either $A_2CuO_4$ or $L_2CuO_4$ may be replaced by at least one of Ag, Au, Pd and Pt. Further, a part or whole of A and L of $A_2CuO_4$ and $L_2CuO_4$ can be replaced by at least one of Sr, Ca, Ba and Mg.

Considering the above-mentioned facts, the minimum thickness of each thin film 4 or 5 should be equal to or larger than the value of the lattice constant. The maximum thickness of the superconducting thin film itself is about 1000 Å and preferable thickness is about 100 Å.

The superconducting thin film of FIG. 8 can be produced by laminating an $A_2CuO_4$ films 4 and an $L_2CuO_4$ film 5 on a substrate 1 by epitaxial growth or sputtering in one direction. By laminating the $A_2CuO_4$ film and the $L_2CuO_4$ film, these films having different lattice constants, the crystallizability of $A_2CuO_4$ is enhanced. When a single phase film of $A2Cu_{04}$ is formed, there is a tendency to vary the growth direction with an increase of the film thickness and to change the crystal plane which grows in parallel with the substrate surface with an increase of the film thickness. In contrast, in the case of rare earth oxide laminated films of $A_2CuO_4$ and $L_2CuO_4$, the crystal plane does not change its growth with an increase of the film thickness and retains its growing direction almost constantly.

Conditions for vapor deposition and sputtering as shown in Tables 2 and 3 can also be employed in this case.

The resulting alternately laminated films of $A_2CuO_4$ and $L_2CuO_4$ are small in defects and show no disorder of lattice, so that the scattering of electrons due to lattice vibrations is a little. Further, the laminated films of $A_2CuO_4$ having high periodicity and $L_2CuO_4$ have lattice strain of interface of and $L_2CuO_4$, so that lattice vibration of one side is related at near laminated layer interface, which results in making the amplitude of the lattice vibration smaller than the case of a single phase film. In addition, since rare earth oxide films having a laminated period have a periodic potential in the laminating direction, electrons flow in a low potential portion. Therefore, since the vibration of electrons in the laminating direction is small, the electron-electron mutual action is a little and there can be obtained a high Tc.

This invention is illustrated by way of the following Examples.

EXAMPLE 1

Alternately laminated films of $L_2CuO_4$ and $Lu_2CuO_4$ having a laminating period D (=a long range ordering) as shown in FIG. 1 were prepared by a molecular beam epitaxial (MBE) method with the conditions as shown in Table 4.

TABLE 4

| Reached degree of vacuum | $<1 \times 10^{-10}$ Torr |
|---|---|
| Substrate temperature | >500° C. |
| Vapor deposition rate | 1 Å/sec |
| Substrate | Sapphire |
| Oxygen gas pressure | 1 mm Torr |

The source of vapor deposition was obtained by sintering oxide powders such as $La_2O_3$ and $Lu_2O_3$, and powders of $Cu_2O$ and CuO in an atmosphere containing oxygen. As the substrate, it was also possible to use a substrate of MgO or $ZrO_2$.

The reached degree of vacuum means a degree of vacuum obtained by maintaining the temperature at about 100° C. higher than the substrate temperature at the vapor deposition for 30 minutes, followed by gradual cooling. The $L_2CuO_4$ film and the $Lu_2CuO_4$ film were laminated alternately with a film thickness ratio of 1:1.

In the case of laminating the films with the laminated period (D) of 25 Å and film thickness ratio of 1:1, $La_2CuO_4$ was vapor deposited as a first layer by controlling the vapor deposition time with a shutter so as to grow the film to the film thickness of 12.5 Å In order to ascertain that the vapor deposited film was a continuous film, well in crystallinity and uniform, the film was produced by observing a RHEED pattern during vapor deposition. On the first layer of $La_2CuO_4$ having a film thickness of 12.5 Å, there was formed a second layer of $Lu_2CuO_4$ having a film thickness of 12.5 Å by vapor deposition. By repeating these procedures, a thin film with a total film thickness of about 0.5 μm or more was produced. The outermost layer (the surface layer) was a layer of $Lu_2CuO_4$.

The laminated period (D) of the produced thin film was measured by X-ray diffraction pattern with a small angle region. It was admitted that there was a long period ordering (LRO) structure with the prescribed period D in the resulting thin film.

The relationship between the electrical resistivity (ρ) and the temperature (T) of the laminated film were measured and shown in FIG. 1.

As is clear from FIG. 1, as to the electrical resistivity (ρ), the Tc increases with a decrease of the laminating period D and shows Tc=78K at D=25 Å. Further, with a decrease of D, the change of p is rapid near the Tc and it becomes impossible to observe an increase of ρ at the temperature directly above the Tc.

The relation between the Tc and D as shown in FIG. 1 seems to be related to the crystallizability of the rare earth oxide. When the film thickness of one layer increases, there takes place a growth at a crystal direction shifted from a preferential growth direction, so that there bring about defects (dislocations and holes) in the film due to the difference in the growth direction. These defects scatter electrons relating to superconductivity and cause to lower the Tc.

EXAMPLE 2

Various alternately laminated rare earth oxide films of $La_2CuO_4$ and a rare earth oxide as listed in Table 5 were produced under the same conditions as shown in Table 4 in Example 1 with the oxide film thickness ratio of 1:1 and D=50 Å. The Tc was measured by the electrical resistivity method and shown in Table 5.

TABLE 5

| Oxide films | Tc (K) |
| --- | --- |
| $Ce_2CuO_4$ | 76 |
| $Pr_2CuO_4$ | 72 |
| $Nd_2CuO_4$ | 65 |
| $PmCuO_4$ | 43 |
| $SmCuO_4$ | 41 |
| $EuCuO_4$ | 35 |
| $GdCuo_4$ | 37 |
| $TbCuO_4$ | 40 |
| $Dy_2CuO_4$ | 52 |
| $Ho_2CuO_4$ | 74 |
| $Er_2CuO_4$ | 62 |
| $Tm_2CuO_4$ | 53 |
| $Yb_2CuO_4$ | 67 |

As is clear from the results of Table 5, when rare earth elements of Ce, Pr and Ho are used, the Tc becomes over 70K.

EXAMPLE 3

The influence of film thicknesses of laminated films of $La_2CuO_4$, and $Lu_2CuO_4$ on the $\rho$ was examined. Alternately laminated films were produced in the same manner as described in Example 1. The thickness of the $La_2CuO_4$film was made 12.5 Å and the thickness of the $Lu_2CuO_4$ film was changed as shown in FIG. 2, wherein the ratio of a single phase thickness of $La_2CuO_4$ to a single phase thickness of $Lu_2CuO_4$ is shown.

The relationship between the p and the temperature is shown in FIG. 2.

As is clear from FIG. 2, with an increase of the $Lu_2CuO_4$ film thickness, the Tc is lowered and shows 20K at the film thickness ratio of 1:10 (the single phase thickness of $Lu_2CuO_4$ being 125 Å). This shows that when the film thickness of one of the rare earth oxide films is increased, the Tc is lowered.

EXAMPLE 4

The influence of the oxygen gas pressure ($P_{O2}$) during the vapor deposition on the $\rho$ in the production of alternately laminated films of $La_2CuO_4$ and $Lu_2CuO_4$ produced in the same manner as described in Example 1 (except for the oxygen gas pressure) was examined. The results are shown in FIG. 3.

As is clear from FIG. 3, with an increase of the oxygen gas pressure, the Tc increases to 95K at $PO_2 = 10$ mTorr. When the oxygen gas pressure is low, oxygen atoms in the rare earth oxides become insufficient and the number of oxygen atoms arranged on the octahedron is lowered, which results in causing disorder of the lattice vibration and lowering the Tc.

EXAMPLE 5

FIG. 4 shows the results obtained when Cu in the alternately laminated films of $La_2CuO_4$ and $Lu_2CuO_4$ was replaced by Ag, Au, Pd and Pt. Other conditions were the same as described in Example 1.

As is clear from FIG. 4, when Cu is replaced by Ag, the Tc increases to 85K. On the other hand, when Cu is replaced by Au, Pd, and Pt, the $\rho$ is increased compared with the case of not replaced and thus the Tc is lowered in these cases.

EXAMPLE 6

FIG. 5 shows the $\rho$ of alternately laminated rare earth oxide films of $(La, X)_2CuO_4$ and $La_2CuO_4 2Cu_{04}$, wherein X is Mg, Sr, Ba, or Ca. The film thickness ratio was 1:1 and the laminating period D was 25 Å. The adding amount of X element was La:X=9:1. Other conditions were the same as described in Example 1.

In FIG. 5, the $\rho$-T curve of the alternately laminated films of $La_2CuO_4$ and $Lu_2CuO_4$ was also shown for comparison. As is clear from FIG. 5, the Tc becomes 75K or higher in all the cases and shows as high as about 100K in the case of the alternately laminated films of $(Lu_{0.45}Ba_{0.05})_2CuO_4$ and $La_2CuO_4$.

EXAMPLE 7

Figure 6:
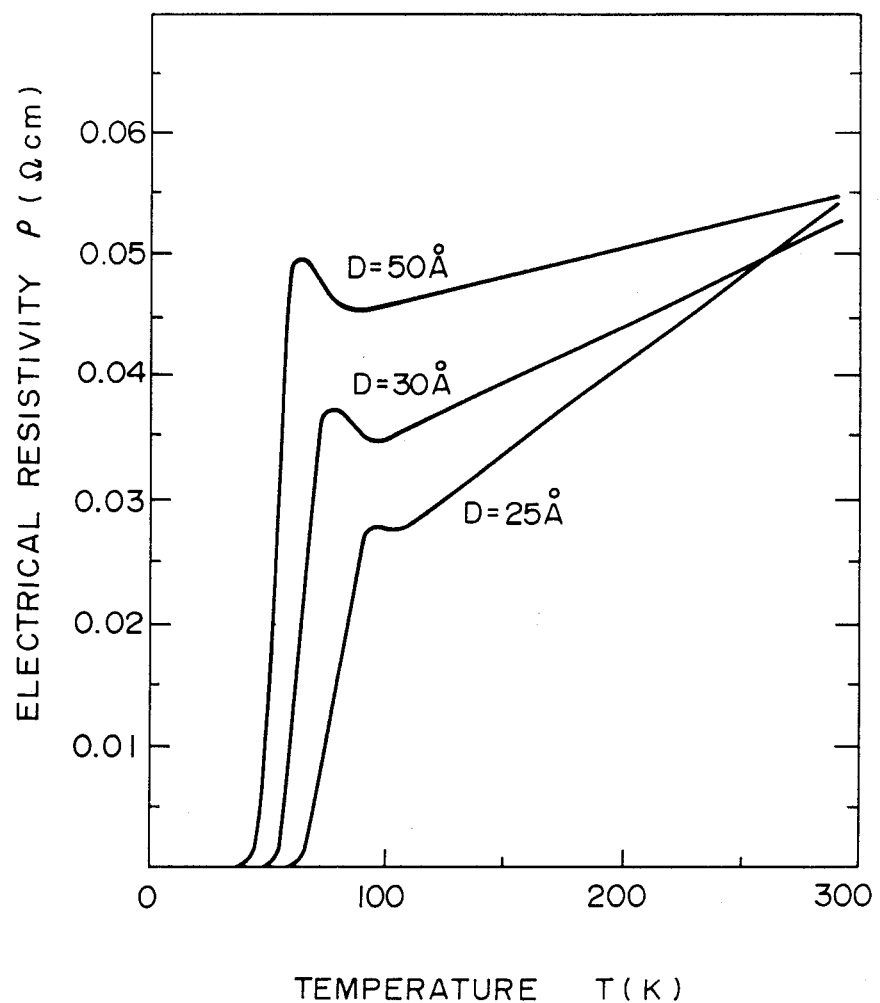

FIG. 6 shows the p of rare earth oxide films when laminated under the oxygen gas pressure ($P_{O2}$) of 10 mTorr with the film thickness ratio of Cu to $La_2CuO_4$ being 1:1. Other conditions were the same as described in Example 1.

As is clear from FIG. 6, with a shortened period D, the Tc increases and becomes Tc=60K at D=25 Å. Further, the Tc value depends on the $P_{O2}$. As shown in FIG. 3, there is a tendency to lower the Tc with a decrease of the $P_{O2}$.

As mentioned above, according to this invention, when rare earth oxides are to have the long range ordering structure and controlled in the crystallizability and lattice defects, thin films having the superconducting critical temperature (Tc) of 30K or higher can be obtained. The Tc is greatly influenced, particularly by the kinds of rare earth elements, periodicity, metal elements and point defects of oxygen atoms in the oxygen octahedral structure. But as shown in Examples, the Tc of higher than 77K (the temperature of liquid nitrogen) can be obtained. Thus, such thin films can be applied to superconducting films using liquid nitrogen as a cooling medium. Further applications of this invention are those in Josephson devices and superconducting transistors using liquid nitrogen as a cooling agent.

What is claimed is:

1. A superconducting thin film comprising at least one layer of a Cu—O atomic pair film and a layer of an oxide film superposed on said Cu—O atomic pair film, and having a long range ordering and a uniform lattice strain, said oxide film being made of oxides of at least one element selected from the group consisting of Na, K, Be, Mg, Ca, Sr, Ba, Sc, Y, the lanthanide elements 57 to 71, Ti, Zr, V, Nb, In, Sn, Tl, Po, Ir, Bi and Pb, and a total thickness of said Cu—O atomic pair film and said oxide film being more than 11.3 Å but not greater than 1,000 Å.

2. A superconducting thin film according to claim 1, wherein at least a part of Cu is replaced by a face-centered cubic element selected from the group consisting of Ag, Au, Pd and Pt.

3. A superconducting material according to claim 1, wherein the another oxide film is a film of $SrO_2$, $CaO_2$, $SnO_2$, $Tl_2O_3$, $Bi_2O_3$, $Tm_2O_3$, $Yb_2O_3$ or $Lu_2O_3$.

* * * * *